United States Patent
Hashimoto

(10) Patent No.: US 6,323,668 B1
(45) Date of Patent: Nov. 27, 2001

(54) IC TESTING DEVICE

(75) Inventor: Yoshihiro Hashimoto, Urawa (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/355,118

(22) PCT Filed: Nov. 20, 1997

(86) PCT No.: PCT/JP97/04227

§ 371 Date: Aug. 31, 1999

§ 102(e) Date: Aug. 31, 1999

(87) PCT Pub. No.: WO99/27375

PCT Pub. Date: Jun. 3, 1999

(51) Int. Cl.$^7$ .................................................. G01R 31/02
(52) U.S. Cl. .................................................. 324/763
(58) Field of Search ............................ 324/765, 763, 324/158.1; 714/733, 734, 736

(56) References Cited

U.S. PATENT DOCUMENTS 5,726,997 * 3/1998 Teene .................... 371/22.3
5,917,331 * 6/1999 Persons ................. 324/765

FOREIGN PATENT DOCUMENTS

| 6170777 | 5/1986 | (JP) . |
| 6 1228369 | 10/1986 | (JP) . |
| 6160487 | 6/1994 | (JP) . |
| 980114 | 3/1997 | (JP) . |

* cited by examiner

Primary Examiner—Safet Metjahic
Assistant Examiner—E P LeRoux
(74) Attorney, Agent, or Firm—David N. Lathrop, Esq.; Gallagher & Lathrop

(57) ABSTRACT

In an IC testing apparatus, a current detecting resistor is connected to a power supply terminal of an IC under test and a switch is provided to bypass large currents while the IC operates. The switch is opened when the IC is in a quiescent mode so that the voltage across the current detecting resistor can be used to measure quiescent current. The IC is judged to be non-conforming article if the measured quiescent current is greater than a prescribed value. A control is provided to close the switch whenever the voltage across the current detecting resistor rises above as prescribed value, and to delay opening the switch when the voltage falls below the prescribed value.

18 Claims, 4 Drawing Sheets

IC TESTING DEVICE

TECHNICAL FIELD

The present invention relates to an IC testing apparatus which measures a current flow of a power supply to a semiconductor integrated circuit element constructed by a MOS type circuit to determine whether the element has a defect or not.

BACKGROUND OF THE INVENTION

A MOS type circuit has a feature that it consumes a current only when an active element therein inverts its state, while there flows merely infinitesimal current such as a current flowing through an insulation resistance or so when all of active elements are in their quiescent state.

A testing method has been heretofore known, which comprises the steps of measuring a power supply current flowing through a semiconductor integrated circuit element constructed by a MOS type circuit in its quiescent state, and determining the presence of a short-circuit failure or an open-circuit failure in the semiconductor integrated circuit element depending on whether the measured value of the power supply current is greater than a prescribed value or not, thereby determining whether the semiconductor integrated circuit element has a defect or not.

FIG. 4 shows an example of the conventional testing method. An IC under test 11 has a power supply terminal 11A connected to a power supply circuit 12 which in turn supplies to the power supply terminal 11A a power supply voltage Vdd which has been prescribed for the IC under test 11, and a power supply terminal 11B of the IC under test 11 through which a current flows out of the IC under test 11 is connected to a common potential point COM.

The power supply circuit 12 comprises an operational amplifier 12A, and a digital-to-analog (D/A) converter 12B operating as a voltage source, which is arranged to be capable of supplying a current $I_P$ (see FIG. 5) consumed in a pulse-like manner by the IC under test 11 without any delay.

Specifically, a voltage which is the same as the voltage Vdd to be applied to the power supply terminal 11A of the IC under test 11 is applied from the D/A converter 12B to the non-inverting input terminal of the operational amplifier 12A. An output terminal of the operational amplifier 12A is connected through a current measurement means 13 to a sensing point SEN, thereby to apply the power supply voltage Vdd to the power supply terminal 11A of the IC under test 11 through the sensing point SEN as well as to feed a voltage at the sensing point SEN back to the inverting input terminal of the operational amplifier 12A.

With the above circuit construction of the power supply circuit 12, by generating the power supply voltage Vdd to the IC under test 11 from the D/A converter 12B to supply the voltage Vdd to the non-inverting input terminal of the operational amplifier 12A, the operational amplifier 12A performs a feedback operation such that the voltage V1 at the sensing point SEN coincides with the voltage Vdd applied to the non-inverting input terminal of the operational amplifier 12A, and this feedback operation continues to supply the voltage Vdd to the power supply terminal 11A of the IC under test 11.

A current detecting resistor Ri is connected between the output terminal of the operational amplifier 12A and the sensing point SEN, and a voltage produced across the current detecting resistor Ri is measured, thereby to measure a current Idd passing through the IC under test 11. In this example, a measurement of the current Idd (see FIG. 5) when the IC under test 11 is in its quiescent state will be described. Since the current Idd which flows under the quiescent state is of the order of several micro-amperes ($\mu$A) to several tens of $\mu$A, the resistance of the current detecting resistor Ri will be as high as the order of 100 kilohms (k$\omega$). Accordingly, two diodes D1 and D2 are connected in parallel with the current detecting resistor Ri to bypass the current $I_P$ that flows when the IC under test 11 is turned to be operative.

A voltage produced by the current Idd flowing through the current detecting resistor Ri is at most of the order of several tens of millivolts (mV). Accordingly, within a range of voltages produced by the current Idd to be measured, the diodes D1 and D2 maintain their off state. The voltage produced across the current detecting resistor Ri is taken out by a subtraction circuit 13A and given to an output terminal 13B. The voltage $V_M$ supplied to the output terminal 13B undergoes an analog-to-digital (A/D) conversion in an A/D converter, for example, and the current Idd is calculated or computed from the value of the voltage $V_M$. If the calculated current Idd is greater than a prescribed value, that IC is determined to be defective (failure) or non-conforming article. The measurement of the current Idd is carried out by inputting a test pattern signal to input terminals 11C of the IC under test 11 and setting the inside of the IC to various quiescent modes, and if the measured values of the current Idd are less than the prescribed value in all of the quiescent modes, the IC is determined to be conforming or pass article.

As noted, this power supply circuit 12 consumes the current $I_P$ in a pulse-like manner when the IC under test 11 is turned to be operative. Though the current $I_P$ is supplied from the power supply circuit 12 constituted by the operational amplifier 12A, a delay or lag is produced in a response of the operational amplifier 12A because a large current (several mA to several tens of mA) flows transiently through the operational amplifier 12A. For this reason, a technique or procedure has been adopted, which connects a smoothing capacitor C1 having a relatively large capacitance to the output side of the power supply circuit 12, thereby to compensate for a reduction in the voltage/current accompanied by the response lag of the power supply circuit 12.

As discussed above, the necessity of connecting the smoothing capacitor C1 having a large capacitance results in that when there occurs any slight noise at the sensing point SEN, a noise current $I_{c1}$ flows through the smoothing capacitor C1. Since the noise current $I_{c1}$ is supplied from the current measurement means 13, it may interfere with the measurement of the current Idd.

Consequently, the recent trend is toward use of a technique or procedure as shown in FIG. 6 in which a current detecting resistor Ri is connected between the power supply terminal 11B of the IC under test 11 through which any current flow is taken out of the IC under test 11 and a point of common potential (COM), and a voltage produced across this current detecting resistor Ri is measured, thereby to calculate or compute the current Idd.

In this case, a short-circuit switch 14 is connected in parallel with the current detecting resistor Ri. This short-circuit switch 14 is controlled to turn on upon an inverting operation of the IC under test 11, and a large current $I_P$ occurring at that time is to be bypassed through the short-circuit switch 14. For this end, a transistor called DMOS or the like is used as the short-circuit switch 14, the transistor being capable of operating at a high-speed and yet exhibiting a low resistance when it turns on.

With the circuit construction shown in FIG. 6, the quiescent current Idd (current flow in quiescent state of the IC under test) hardly changes even if there is some variation in the power supply voltage, provided that the voltage of the power supply circuit 12 remains at a voltage equal to or higher than a fixed value. In other words, there is obtained an advantage that the quiescent current Idd can be measured in a stable condition without being influenced by the noise current passing through the smoothing capacitor C1.

On the other hand, however, if a relatively large current should flow through the current detecting resistor Ri due to that the short-circuit switch 14 turning off too early timing or that a short-circuit failure or the like occurs within the IC under test 11, thereby to produce the current Idd which is larger than the prescribed value, or the like, a high voltage is produced across the current detecting resistor Ri to raise the voltage at the power supply terminal 11B through which any current flow is taken out of the IC 11, resulting in a possibility of causing a malfunctioning of the IC under test 11. In addition, if a wiring used to connect the short-circuit switch 14 has an inductance component, there is a possibility that the flow of a pulse-like current of a substantial magnitude through the inductance component may produce a spike noise, which results in a damage to the IC under test 11. For this reason, an arrangement is such that a diode D3 is connected in parallel with the current detecting resistor Ri, thereby to prevent the voltage at the power supply terminal 11B from abnormally rising due to a spike noise or the like.

Moreover, when the diode D3 is connected in such manner, there is a disadvantage that since a diode generally has an off capacitance component due to the PN junction thereof (a capacitance when the diode is in off state), if a spike current is charged in the off capacitance of the diode D3 by a noise voltage or the like under the off state of the short-circuit 14, the discharge path of the off capacitance of the diode D3 will be only the current detecting resistor Ri, which results in a long discharge time duration needed by the diode D3. Stated differently, the measurement of the current Idd must be done after the discharge of the diode D3 has completed, resulting in a drawback that it takes much time duration to measure the current Idd.

It is an object of the present invention to provide an IC testing apparatus which is capable of eliminating above-mentioned disadvantages, and measuring a quiescent current Idd of an IC under test flowing therethrough when the IC is in its quiescent state safely and at high-speed, thereby to determine whether the IC is conforming (pass) or non-conforming (failure) article.

DISCLOSURE OF THE INVENTION

In accordance with the present invention, there is provided an IC testing apparatus in which a current detecting resistor is connected between a power supply terminal of an IC under test through which any current flow is taken out and a point of common potential, a short-circuit switch is connected in parallel with the current detecting resistor, under the condition that a large current is consumed by the IC under test, the large current is bypassed by the short-circuit switch, while the short-circuit switch is off, a voltage produced across the current detecting resistor is measured, and a current of the IC under test during its quiescent state is measured on the basis of the measured voltage, thereby to determine whether the IC is conforming or non-conforming article depending on whether or not the value of the measures quiescent current is equal to or less than a predetermined value, and comprises: control means for detecting, in a control mode in which the short-circuit switch is controlled to its off state, the rising of a voltage produced across the current detecting resister to or above a predetermined value, thereby to perform a control in which the short-circuit switch is returned to its on state; and delay control means provided in a control circuit which controls the short-circuit switch from its on state to its off state, and for delaying the inverting operation of the short-circuit switch from on state to off state to cause the short-circuit switch to be gradually turned to its off state.

With the above construction of the IC testing apparatus according to the present invention, the provision of the control means which returns the short-circuit switch to its on state whenever the rising of the voltage produced across the current detecting resistor to or above a predetermined value is detected as the short-circuit switch is controlled to be off allows the occurrence of a high voltage across the current detecting resistor to be prevented by returning the short-circuit switch to its on state if the IC under test contains an internal failure to produce an influence of a short-circuit failure under a signal condition which is input to the IC under test which would cause a value of the power supply current which is in excess of a predetermined value, whereby the turn-off of the short-circuit switch would cause the rising of the voltage across the current detecting resistor to an abnormal value.

Consequently, the occurrence of a malfunctioning or any damage of the IC under test can be prevented. In addition, since in accordance with the present invention, delay control means is provided which causes a gradual delay in the operation of the short-circuit switch being controlled to be off as it is controlled to be off, the operation of the control means which returns the short-circuit switch to its on state in the event of a voltage produced across the current detecting resistor exceeding a prescribed value when the short-circuit switch is controlled to be off can be performed with a high accuracy. As a consequence, a further assurance against the occurrence of the situation in which a voltage produced across the current detecting resistor may fluctuate largely is provided, thus yielding an advantage that the occurrence of the accidents such as the malfunctioning, destruction or the like of the IC under test can be prevented in twofold manner.

The present invention further proposes an IC testing apparatus having a plurality of parallel short-circuit switches. With an arrangement including a plurality (N) of parallel short-circuit switches, the inductance of a wiring which connects an IC under test to the short-circuit switches will be reduced by a factor of N, thus sufficiently minimizing spike noises which may be produced by the inductance.

Furthermore, in accordance with the present invention, a plurality of current detecting resistors are provided, which are selectively connected in circuit by a range changing switch, thereby providing an advantage that a current measuring range which is appropriate to the measurement of a current through the IC under test can be selected.

The present invention is further provided with decision means which samples a voltage produced across the current detecting resistor at a given time interval when the short-circuit switch is in its off state and which determines if the IC under test is conforming or non-conforming article depending on whether a variation of respective sample value is equal to or above or equal to or less than a prescribed value, thus providing an advantage that it is possible to determine if the IC under test is conforming or non-conforming article in a relatively short time interval.

Thus, if a decision technique is employed which determines whether the IC under test is conforming or nonconforming article by seeing whether or not a voltage produced across the current detecting resistor has exceeded a prescribed value, time must be spent to monitor whether or not the voltage produced across the current detecting resistor reaches the prescribed value. This takes time until a result of decision is rendered, resulting in a disadvantage that the test requires an increased length of time. By contrast, according to the present invention, this point is improved in that a variation in the value of the voltage produced across the current detecting resistor is monitored through the plurality of samplings. If a variation of the respective sample value is equal to or less than a prescribed value, this means that the rate-of-rise is low, indicating that a final value will be low, thus providing an advantage that a decision of conforming or nonconforming article can be made within a relatively short time interval.

BEST MODES FOR CARRYING OUT THE INVENTION

Figure 1:
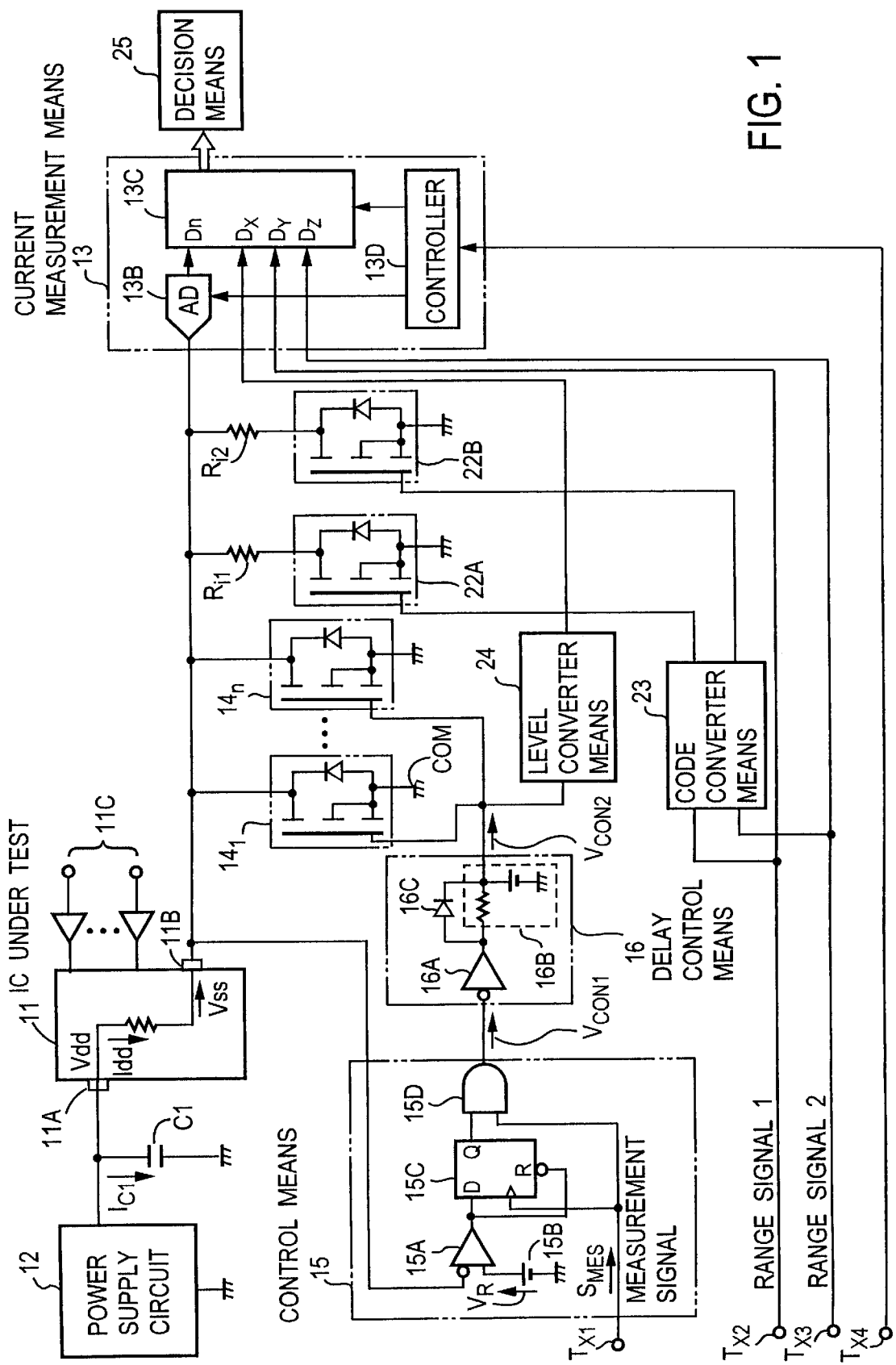
FIG. 1 is a circuit diagram illustrating an embodiment of the IC testing apparatus according to the present invention.
Figure 4:
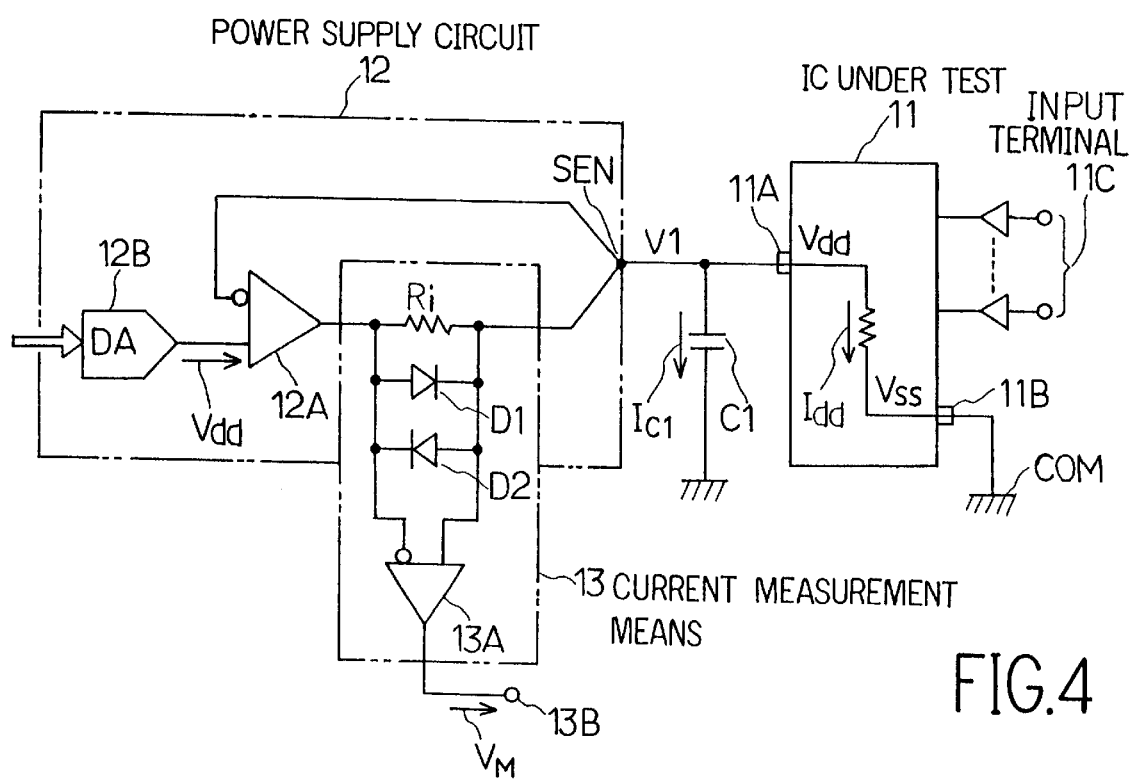
FIG. 4 is a circuit diagram illustrating a prior art.
Figure 5:
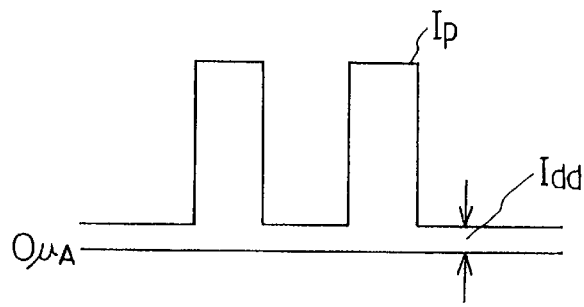
FIG. 5 is a waveform diagram illustrating the operation of FIG. 4.
Figure 6:
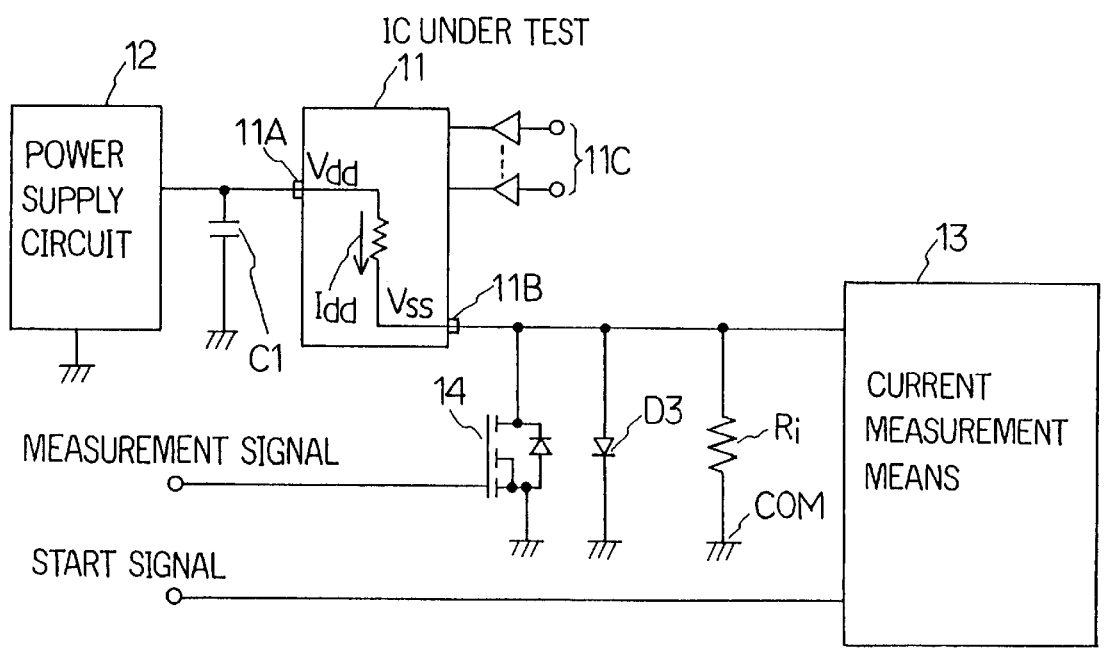
FIG. 6 is a circuit diagram of another example of the prior art.

FIG. 1 shows an embodiment of the IC testing apparatus according to the present invention. Parts or portions in FIG. 1 corresponding to those shown in FIGS. 4 and 6 are shown by the same reference characters affixed thereto. The present invention is characterized in: in an IC testing apparatus in which a current detecting resistor Ri and a short-circuit switch 14 are connected in parallel between a power supply terminal 11B of an IC under test 11 through which any current flow is taken out and a point of common potential COM, and wherein under the condition that a large current is consumed by the IC under test 11, the short-circuit switch is controlled to its on state, while in a quiescent state of the IC under test, the short-circuit switch 14 is controlled to be its off state to measure a voltage produced across the current detecting resistor Ri, and a current Idd which flows through IC under test is calculated from the voltage value to determine whether the IC under test is conforming or nonconforming article depending on the current value, that control means 15 is provided, which detects, in a control mode in which the short-circuit switch 14 is controlled to its off state, the rising of a voltage produced across the current detecting resister Ri to or above a predetermined value, thereby to perform a control in which the short-circuit switch 14 is returned to its on state; and that there is provided delay control means 16 provided in a control circuit which controls the short-circuit switch 14 from its on state to its off state, the delay control means 16 controlling the inverting operation of the short-circuit switch 14 from on state to off state by a voltage signal gradually varying in its voltage.

The control means 15 may comprise an operational amplifier 15A, a voltage source 15B for generating a comparison voltage $V_R$, a latch circuit 15C and a gate circuit 15D. The operational amplifier 15A has an inverting input terminal to which a voltage $V_{SS}$ generated at the power supply terminal 11B of an IC under test 11 is supplied, and a non-inverting input terminal to which the comparison voltage $V_R$ from the voltage source 15B is supplied. The comparison voltage $V_R$ is selected to be a voltage lower than a voltage on which the IC under test begins to malfunction (erroneouly operate) as the voltage $V_{SS}$ at the power supply terminal 11B of the IC under test 11 rises, for example, of the order of several mV, whereby the operational amplifier 15A continues to output an H logic in normal condition whether the short-circuit switch 14 is either of its on state or its off state. By contrast, in an abnormal condition, the voltage $V_{SS}$ at the power supply terminal 11B goes to a voltage higher than the comparison voltage $V_R$, whereby the logical value of the output of the operational amplifier 15A falls to L logic.

Each time a measurement signal $S_{MES}$ (FIG. 2C) which is inputted from a terminal $T_{X1}$ rises up, the latch circuit 15C reads therein the output status or H logic at the output of the operational amplifier 15A. Accordingly, the latch circuit 15C outputs an H logic from its output terminal Q to supply the H logic to one input terminal of the gate circuit 15D. Since the measurement signal $S_{MES}$ is inputted to the other input terminal of the gate circuit 15D, the gate circuit 15D outputs a signal of H logic as long as the measurement signal $S_{MES}$ remains at its H logic, and outputs an L logic when the measurement signal $S_{MES}$ falls to its L logic.

The signal outputted from the control means 15 is suplied to the delay control means 16 which is constituted by an inverter 16A, a time constant circuit 16B and a diode 16C which blocks a reverse current flow. Under the condition that the large current flows through the IC under test 11, the measurement signal $S_{MES}$ is maintained at its L logic. Accordingly, this L logic signal is inverted in polarity to H logic in the delay control means 16 before it is applied to the gate of the short-circuit switch 14, and the short-circuit switch 14 is maintained in its on state. As a result, under this condition, the large current which flows through the IC under test 11 passes to the point of common potential COM through the short-circuit switch 14.

Now, the operations with respect to the control means 15 and the delay control means 16 will be described in succession. Under the condition that the control means 15 outputs an H logic, the short-circuit switch 14 is controlled to its off state. When the measurement signal $S_{MES}$ is inverted to its L logic under this condition, the output $V_{CON1}$ of the control means 15 falls to its L logic. The delay control means 16 inverts the polarity of this L logic signal on the output $V_{CON1}$, thereby to raise a potential of the input of the time constant circuit 16B to its H logic. As a result, the reverse flow blocking diode 16C is caused to be conductive by the voltage having the H logic, thereby rapidly charging a capacitor which constitutes the time constant circuit 16B. Accordingly, an output signal from the delay control means 16 rises up without any time lag, in the case that it is inverted to its H logic, at the same time when the measurement signal $S_{MES}$ falls to its L logic.

By contrast, when the measurement signal $S_{MES}$ rises to its H logic, the output of the control means 15 rises to its H logic. As a result, the output from the inverter 16A which constitutes the delay control means 16 falls to the L logic, but, at this time, the positive charges already charged in the capacitor which constitutes the time constant circuit 16B are prevented from being absorbed into the inverter 16A by the diode 16C, and are gradually discharged through a resistor which constitutes the time constant circuit 16B. Accordingly, by setting the resistance value of the resistor to a high resistance value, it is possible to cause a voltage $V_{CON2}$ already charged in the capacitor to be gradually decreased, as shown in FIG. 2G.

In this manner, in a mode in which the control voltage $V_{CON2}$ applied to the gate electrode of short-circuit switch 14 is controlled to turn the short-circuit switch 14 off, a delayed control takes place so that the voltage $V_{CON2}$ is gradually returned to zero, thereby allowing a switching from the condition in which a large current flows as the power supply current Idd through the IC under test 11 to a condition in which the short-circuit switch 14 is turned off after being stabilized in a quiescent mode. As a consequence, the short-circuit switch 14 can be controlled to its off state while suppressing the occurrence of a high voltage across the current detecting resistor $R_i$, allowing the control means 15 to be operated in a stable manner.

Additionally, the present invention proposes the provision of a plurality of short-circuit switches $14_1 \sim 14_n$ for the short-circuit switch 14. When the plurality of short-circuit switches $14_1 \sim 14_n$ are provided, an inductance component which occurs in the wiring which connects between the power supply terminal 11B of the IC under test 11 and the short-circuit switches $14_1 \sim 14_n$ can be reduced. When the number of short-circuit switches $14_1 \sim 14_n$ is equal to N, the inductance component can be reduced by a factor of N in comparison to the use of a single short-circuit switch. By allowing the inductance component to be reduced in this manner, when a relatively large current passes through short-circuit switches $14_1 \sim 14_n$ as the IC under test is operated, the occurrence of spike noises, for example, which may be produced by the inductance component can be suppressed, providing an advantage that an accident of destructing an IC under test 11 may be prevented.

Figure 3:
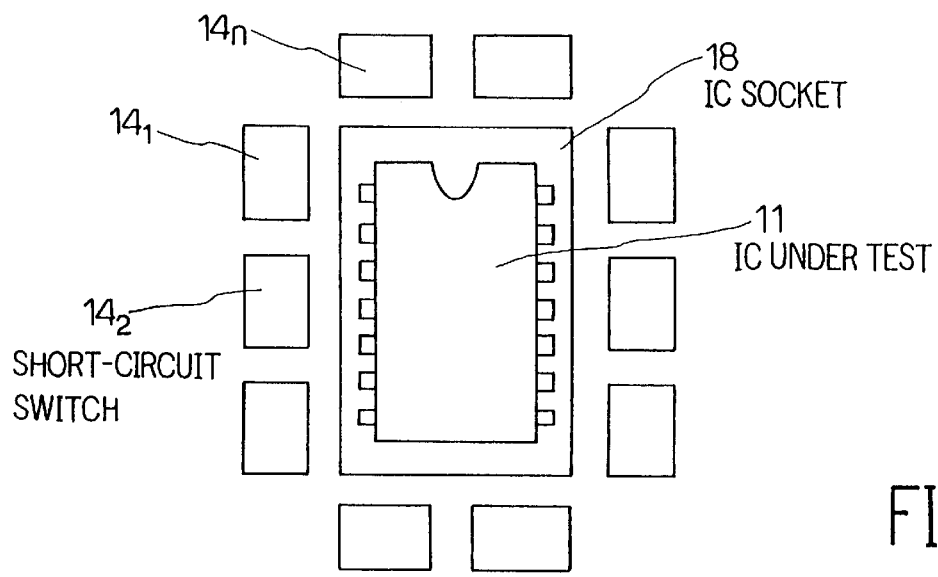
FIG. 3 is a plan view illustrating the layout of short-circuit switches where a plurality of short-circuit switches as shown in FIG. 1 are provided.

FIG. 3 shows a construction in which the short-circuit switches $14_1 \sim 14_n$ are laid out. In this example, the plurality of short-circuit switches $14_1 \sim 14_n$ are disposed around an IC socket 18 on which the IC under test is mounted, thus minimizing the length of wiring for the respective short-circuit switches $14_1 \sim 14_n$ as short as possible.

In the example shown in FIG. 1, there is shown a construction in which two of current detecting resistors, $R_{i1}$ and $R_{i2}$, are provided, which are selectively connected to the point of common potential COM through range changing switches 22A, 22B. A range signal 1 and a range signal 2 are applied from terminals $T_{X2}$ and $T_{X3}$ to the gates of the range changing switches 22A and 22B to control them so that either one is turned on, thus selectively connecting the current detecting resistors $R_{i1}$ and $R_{i2}$ between the power supply terminal 11B and the point of common potential COM.

Code conversion means 23 which converts the range signal 1 and the range signal 2 into a signal which is suitable to be fed to the range changing switches 22A and 22B. The range signal 1 and the range signal 2 are input to input terminals $D_Y$ and $D_Z$ of a memory 13C which is provided in the current measurement means 13, allowing the selected range condition to be stored in the memory 13C. Level conversion means 24 which translates the control voltage $V_{CON2}$ outputed from the delay control means 16 into a signal which is written into the memory 13C in the current measurement means 13.

Figure 2:
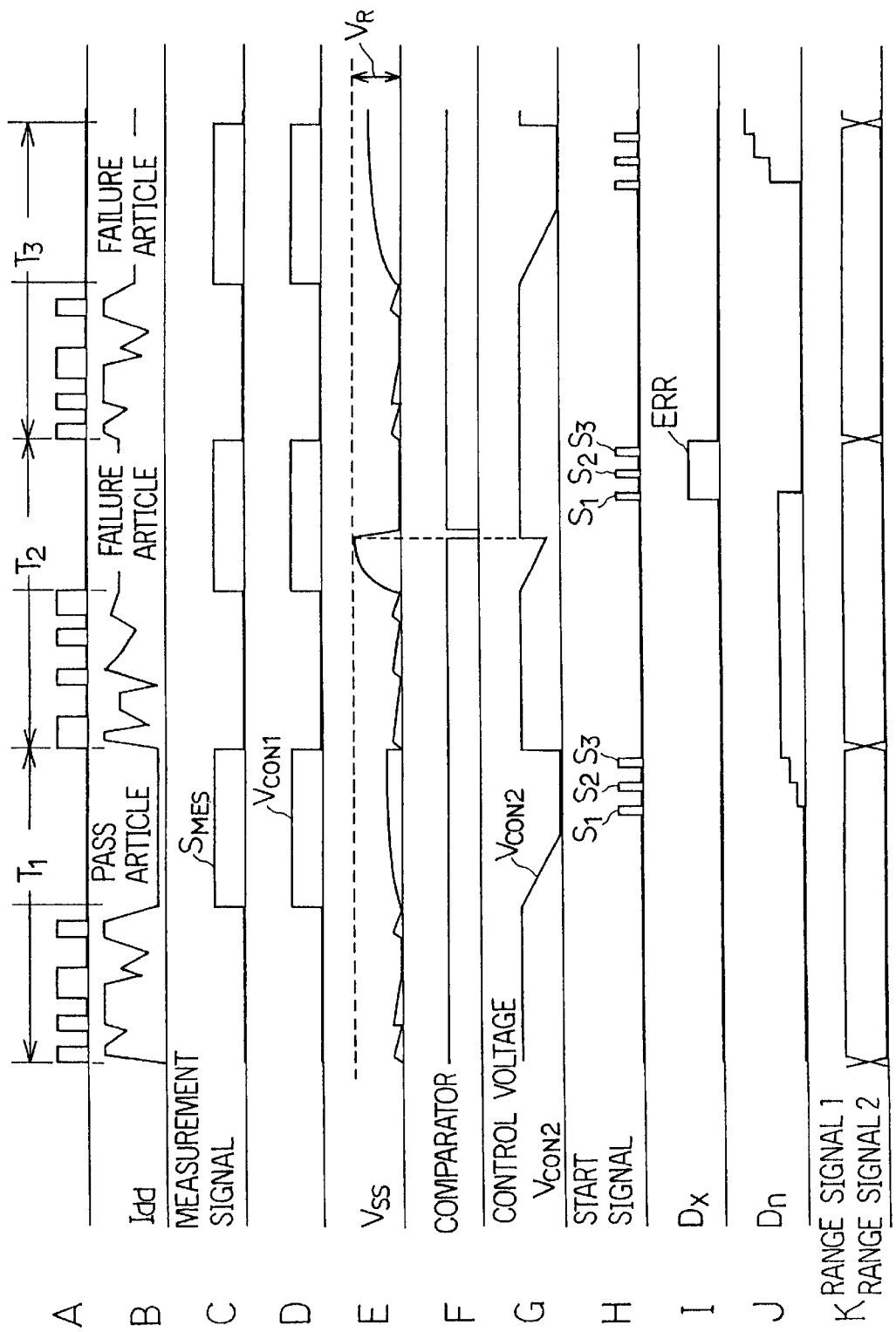
FIG. 2 is a waveform diagram illustrating the operation of the IC testing apparatus according to the present invention.

In the present example, the current measurement means 13 may comprise an AD converter 13B which effects an AD conversion of the voltage produced across the current detecting resistor $R_{i1}$ and $R_{i2}$, the memory 13C which receives and stores the voltage value obtained by the AD conversion in the AD converter 13B and a controller 13D which controls the memory 13C and the AD converter 13B. As shown in FIG. 2, a plurality of start signals $S_1$, $S_2$, $S_3$ are applied to the controller 13D for executing an operation that a voltage produced across the current detecting resistor $R_{i1}$ or $R_{i2}$ is AD converted and received a plurality of times.

Sample data that is stored by the memory 13C is read out into decision means 25, calculating differences between respective samples. If the difference value happens to be equal to or greater than a predetermined value, it is determined that a current value passing through the current detecting resistor $R_{i1}$ or $R_{i2}$ is high, rendering a decision for a failing product. If difference values between respective samples are less than a preset value, it is determined that the current value passing through the current detecting resistor $R_{i1}$ or $R_{i2}$ is small, rendering a decision for a conforming article. This decision is executed in any quiescent mode by applying a variety of pattern signals to the IC under test 11 as indicated in FIG. 2.

In the quiescent mode having a test period $T_1$ shown in FIG. 2, the voltage $V_{SS}$ produced at the terminal 11B is low, and hence a decision for the conforming article is rendered.

During the test period $T_2$ when the short-circuit switches $14_1 \sim 14_n$ return to their off state, the current Idd passing through the IC under test 11 is greater than the current value in the quiescent mode, and hence the voltage $V_{SS}$ rises rapidly and the rise of the voltage $V_{SS}$ is detected by the control means 15 to output an L logic signal (FIG. 2F), whereby the short-circuit switches $14_1 \sim 14_n$ are returned to their on states, thus suppressing the rise of the voltage $V_{SS}$. In this instance, a signal ERR (FIG. 2I) having an H logic is written into the input terminal $D_X$ of the memory 13C, and accordingly, the test period for which the ERR is read out is determined to be failing.

During the test period $T_3$, the rate of rise of the voltage $V_{SS}$ at the power supply terminal 11B is higher than a prescribed value, whereby a decision is rendered that a final current value (to which the current Idd will be stabilized after a prolonged length of time) will be higher than the prescribed value.

As discussed above, in accordance with the present invention, the provision of the control means 16 and the delay control means 16 and the provision of a plurality of short-circuit switches allow a measurement of a current value in a quiescent mode in a safe manner without causing any accident of destructing an IC under test.

In addition, the technique of providing an AD conversion and reception of an increase in the current during the quiescent mode a plurality of times and determining each increment as a difference between samples to predict a final value allows a decision to be rendered whether it is conforming or non-conforming article in a short length of time from the time when the short-circuit switch returns to its off state. Accordingly, there is obtained an advantage that quantities of IC's can be tested in a brief time interval and its effect will be remarkable when used by the IC maker.

What is claimed is:

1. An IC testing apparatus comprising:
   a current detector that is connected between a power supply terminal of an IC under test through which any current flow is taken out and a point of common potential, said current detector comprising a current detecting resistor;
   a short-circuit switch that is connected in parallel with the current dectector, under the condition that a large current is consumed by the IC under test, the large current is bypassed by the short-circuit switch, while the short-circuit switch is off, a voltage produced across the current detecting resistor is measured, and a current of the IC under test during its quiescent state is measured on the basis of the measured voltage, thereby to determine whether the IC is conforming or non-conforming article depending on whether or not the value of the measured quiescent current is equal to or less than a predetermined value;

control means for detecting, in a control mode in which the short-circuit switch is controlled to its off state, the rising of a voltage produced across the current detecting resister to or above a predetermined value, thereby to perform a control in which the short-circuit switch is returned to its on state; and delay control means provided in a control circuit which controls the short-circuit switch from its on state to its off state, and for delaying the inverting operation of the short-circuit switch from on state to off state to cause the short-circuit switch to be gradually turned to its off state.

2. The IC testing apparatus according to claim 1, wherein a plurality of the short-circuit switches are provided and are connected in parallel with each other.

3. The IC testing apparatus according to claim 2 that comprises a plurality of current detectors connected in parallel with each other, wherein each current detector has a switch connected in series with its current detecting resistor.

4. The IC testing apparatus according to claim 1 that comprises a plurality of current detectors connected in parallel with each other, wherein each current detector has a switch connected in series with its current detecting resistor.

5. The IC testing apparatus according to any one of claim 1, 2, 3 or 4, further comprising: a decision means for sampling a voltage produced across the current detecting resistor at regular time intervals in the condition that the short-circuit switch is controlled to be in its off state, and determining the IC under test to be non-conforming article if the amount of variation in the sampled values is equal to or greater than a predetermined value, and determining it to be conforming article if the amount of variation is less than the predetermined value.

6. An IC testing apparatus comprising:

a current detector connected between a power supply terminal of an IC under test through which any current flow is taken out and a point of common potential, said current detector comprising a current detecting resistor;

a short-circuit switch that is connected in parallel with the current detector, said short-circuit switch being switched to its on state under an operative mode of the IC under test such that a large current is consumed by the IC under test, whereby the large current is bypassed by the short-circuit switch, and said short-circuit switch being switched to its off state under a control mode of the IC under test such that a small quiescent current is consumed by the IC under test, whereby the quiescent current flows through the current detector to thereby produce a voltage across the current detector;

decision means for measuring the quiescent current of the IC under test on the basis of a voltage produced across the current detector while the IC under test is in the control mode, and determining whether the IC under test is a conforming article depending on whether the value of the measured quiescent current is equal to or less than a predetermined value;

control means for detecting, in the control mode of the IC under test, whether the voltage produced across the current detector exceeds a comparison value, and controlling the short-circuit switch to switch from its off state to its on state upon detection of the voltage exceeding the comparison value; and delay control means for causing the short-circuit switch to turn from its on state to its off state with a time delay.

7. The IC testing apparatus according to claim 6, wherein said decision means comprises:

means for sampling the voltage produced across the current detector while the IC under test is in the control mode; and means for determining the IC under test to be non-conforming article if the amount of variation in sampled values of said voltage is equal to or greater than a predetermined value, and determining it to be conforming article if the amount of variation is less than the predetermined value.

8. The IC testing apparatus according to claim 6, wherein the current detector comprises a plurality of current detecting resistors having different resistances and a plurality of range changing switches, wherein each of the current detecting resistors is connected in series with a respective one of the range changing switches, the range changing switches being selectively switched to change current measuring range of the current detector.

9. An IC testing apparatus comprising:

a current detector comprising a current detecting resistor, said current detector being connected between a power supply terminal of an IC under test from which a quiescent current to be measured is taken out and a point of common potential;

a short-circuit switch that short circuits the current detector during its on state; and current measurement means for measuring the quiescent voltage produced across the current detector due to flow of the quiescent current of the IC under test through the current detector while the short-circuit switch is in its off state, measuring the quiescent current based on the measured quiescent voltage and determining whether the IC under test is a conforming article depending on whether the value of the thus measured quiescent current is equal to or less than a predetermined value;

control means for alternately switching the short-circuit switch between its on state and off state depending on a measurement signal applied thereto which alternately designates an operative mode and a control mode of the IC under test, so that a large current consumed in the IC under test during the operative mode is bypassed to the point of the common potential and the quiescent current consumed in the IC under test during the control mode flows through the current detector, said control means being responsive to the quiescent voltage produced across the current detector during the control mode in such a manner that it switches the short-circuit switch from its off state to on state when it detects the quiescent voltage exceeds a comparison value; and delay control means for delaying the short-circuit switch in switching from its on state to off state under control of the control means.

10. An IC testing apparatus comprising:

a current detector connected between a power supply terminal of an IC under test through which any current consumed in the IC under test is taken out and a point of common potential, said current detector comprising a current detecting resistor;

a short-circuit switch connected in parallel with the current detector;

control means supplied with a voltage at the power supply terminal of the IC under test and a measurement signal which alternately designates an operative mode of the IC under test such that a large current is consumed therein and a control mode of the IC under test such that a small quiescent current is consumed therein, said control means generating an output signal which designates either a switch-on controlling state for switching the short-circuit switch to its on state responsive to the measurement signal when it designates the operative mode of the IC under test or a switch-off controlling state for switching the short-circuit switch to its off state responsive to the measurement signal when it designates the control mode of the IC under test;

delay control means supplied with the output signal of said control means for controlling said short-circuit switch either to switch from its off state to on state without delay when the output signal of the control means designates the switch-on controlling state and to switch from its on state to its off state with a delay when the output signal of the control means designates the switch-off controlling state; and means for measuring the voltage at the power supply terminal of the IC under test during the control mode of the IC under test, for measuring the quiescent current on the basis of the measured voltage, and for determining whether the IC under test is conforming article depending on whether the value of the measured quiescent current is equal to or less than a predetermined value.

11. The IC testing apparatus according to claim 10, wherein said control means comprises:

first means supplied with the voltage at the power supply terminal of the IC under test for generating an output signal which indicates either
an abnormal condition of the voltage when it detects the voltage is greater than a comparison value or
a normal condition of the voltage when it is less than or equal to the comparison value; and second means responsive to the output signal of the first means and the measurement signal for generating a control voltage as the output signal of said control means which designates either
a switch-on controlling state for controlling said short-circuit switch to its on state during each said operative mode of the IC under test and when the output signal of the first means indicates the abnormal condition of the voltage during each said control mode of the IC under test or
a switch-off controlling state for controlling said short-circuit switch to its off state when the output signal of said first means indicates the normal condition of the voltage during each said control mode of the IC under test.

12. An IC testing apparatus comprising:

a current detector connected between a power supply terminal of an IC under test through which any current flow is taken out and a point of common potential, said current detector comprising a current detecting resistor;

a short-circuit switch connected in parallel with the current detector;

control means responsive to a measurement signal for generating an output signal, wherein the measurement signal alternately designates
an operative mode of the IC under test such that a large current is consumed in the IC under test or
a control mode of the IC under test such that a small quiescent current is consumed in the IC under test, and
wherein the output signal designates either
a first state when the measurement signal designates the operative mode of the IC under test or
a second state when the measurement signal designates the control mode of the IC under test;

delay control means responsive to the output signal of said control means supplied thereto for controlling said short-circuit switch in such a manner that it is switched from its off state to its on state without delay when the output signal of the control means designates the first state and it is switched from the on state to the off state with a delay when the output signal of the control means designates the second state;

current measurement means for measuring a voltage at the power supply terminal of the IC under test during the control mode of the IC under test, and for measuring a quiescent current on the basis of the measured voltage; and decision means for determining whether the IC under test is conforming article depending on whether the value of the measured quiescent current is equal to or less than a predetermined value.

13. The IC testing apparatus according to claim 12, wherein
said first state of the output signal of said control means designates a switch-on controlling state for switching said short-circuit switch (14) to its on state, and
said second state of the output signal of said control means designates a switch-off controlling state for switching said short-circuit switch to its off state.

14. The IC testing apparatus according to claim 12, wherein said control means comprises:

first means supplied with the voltage at the power supply terminal of the IC under test for generating an output signal which indicates either
an abnormal condition of the voltage when it detects the voltage is in excess of a comparison value or
a normal condition of the voltage when it detects the voltage is not in excess of the comparison value; and second means for generating a control voltage as its output signal which designates either
the first state for controlling said short-circuit switch to its on state during each said operative mode of the IC under test and also at such a time when the output signal of the first means indicates the abnormal condition of said voltage during each said control mode of the IC under test, or
the second state for controlling said short-circuit switch to its off state when the output signal of said first means indicates the normal condition of the voltage during each said control mode of the IC under test.

15. The IC testing apparatus according to any one of claims 6, 9, 11 or 14, wherein said comparison value is selected to be a voltage lower than a threshold voltage on which the IC under test begins to malfunction.

16. The IC testing apparatus according to any one of claims 6, 9, 10 or 12 which comprises a plurality of short-circuit switches connected in parallel with each other.

17. The IC testing apparatus according to claim 16 that comprises a plurality of current detectors connected in parallel with each other, wherein each current detector has a respective range changing switch connected in series with its respective current detecting resistor.

18. The IC testing apparatus according to any one of claims 6, 9, 10 or 12 which comprises a plurality of current detectors connected in parallel with each other, wherein each current detector has a respective range changing switch connected in series with its respective current detecting resistor.

* * * * *